US008148272B2

(12) United States Patent
Gao et al.

(10) Patent No.: US 8,148,272 B2
(45) Date of Patent: Apr. 3, 2012

(54) APPLICATION OF MILLISECOND HEATING SOURCE FOR SURFACE TREATMENT

(75) Inventors: David Gao, Shanghai (CN); Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 76 days.

(21) Appl. No.: 12/842,017

(22) Filed: Jul. 22, 2010

(65) Prior Publication Data

US 2011/0053349 A1 Mar. 3, 2011

(30) Foreign Application Priority Data

Aug. 31, 2009 (CN) .......................... 2009 1 0194917

(51) Int. Cl.
*H01L 21/311* (2006.01)
*H01L 21/316* (2006.01)
(52) U.S. Cl. ............... 438/756; 134/1; 134/1.3; 134/26; 134/28; 134/30; 134/902; 257/E21.224; 257/E21.228
(58) Field of Classification Search .................. 438/746, 438/749, 750, 756, 795, 906; 134/1, 1.3, 134/26, 28, 30, 902; 257/E21.224, E21.228, 257/E21.229
See application file for complete search history.

(56) References Cited

U.S. PATENT DOCUMENTS

| | | | | |
|---|---|---|---|---|
| 5,429,730 A * | 7/1995 | Nakamura et al. | ....... | 204/192.34 |
| 5,454,902 A * | 10/1995 | Zinck et al. | .................. | 438/797 |
| 5,639,699 A * | 6/1997 | Nakamura et al. | ............ | 427/527 |
| 5,709,754 A * | 1/1998 | Morinville et al. | ............ | 134/1.3 |
| 5,782,986 A * | 7/1998 | Butterbaugh et al. | ......... | 134/1.3 |
| 5,821,175 A * | 10/1998 | Engelsberg | .................... | 438/795 |
| 5,954,884 A * | 9/1999 | Lawing et al. | .................... | 134/1 |
| 6,015,759 A * | 1/2000 | Khan et al. | .................... | 438/707 |
| 6,066,032 A * | 5/2000 | Borden et al. | .................. | 451/80 |
| 6,183,566 B1 * | 2/2001 | Lawing et al. | .................... | 134/1 |
| 6,230,720 B1 * | 5/2001 | Yalamanchili et al. | ........ | 134/1.3 |
| 6,323,142 B1 * | 11/2001 | Yamazaki et al. | ............ | 438/790 |
| 6,465,374 B1 * | 10/2002 | Butterbaugh et al. | ........ | 438/795 |
| 6,602,349 B2 * | 8/2003 | Chandra et al. | .................. | 134/19 |
| 6,706,648 B2 * | 3/2004 | Yamazaki et al. | ............ | 438/790 |
| 6,767,834 B2 * | 7/2004 | Chung et al. | .................. | 438/709 |
| 7,183,229 B2 * | 2/2007 | Yamanaka | .................... | 438/795 |
| 7,205,228 B2 * | 4/2007 | Padhi et al. | .................... | 438/652 |
| 7,491,659 B2 * | 2/2009 | Yamazaki et al. | ............ | 438/790 |
| 7,514,015 B2 * | 4/2009 | Elliott et al. | .................... | 216/65 |
| 7,838,431 B2 * | 11/2010 | Sanchez | ........................ | 438/706 |
| 2002/0064944 A1 * | 5/2002 | Chung et al. | .................. | 438/637 |
| 2003/0070690 A1 * | 4/2003 | Danese | .......................... | 134/1.3 |
| 2003/0221702 A1 * | 12/2003 | Peebles | ............................ | 134/1 |

(Continued)

*Primary Examiner* — Mary Wilczewski
(74) *Attorney, Agent, or Firm* — Kilpatrick Townsend & Stockton LLP

(57) ABSTRACT

A method for fabricating semiconductor devices, e.g., strained silicon MOS device, includes providing a semiconductor substrate (e.g., silicon wafer) having a surface region, which has one or more contaminants and an overlying oxide layer. The one or more contaminants is at least a carbon species. The method also includes processing the surface region using at least a wet process to selectively remove the oxide layer and expose the surface region. The method further includes subjecting the surface region to a laser treatment process for a time period of less than 1 second to increase a temperature of the surface region to greater than 1000 degrees Celsius to remove the one or more contaminants provided on the surface region. The method also includes removing the laser treatment process to cause a reduction in temperature to about 300 to about 600 degrees Celsius in a time period of less than 1 second.

24 Claims, 5 Drawing Sheets

U.S. PATENT DOCUMENTS

| | | | |
|---|---|---|---|
| 2004/0003828 A1* | 1/2004 | Jackson | 134/1 |
| 2005/0178401 A1* | 8/2005 | Boyers | 134/1.3 |
| 2006/0278254 A1* | 12/2006 | Jackson | 134/21 |
| 2011/0053349 A1* | 3/2011 | Gao et al. | 438/473 |
| 2011/0065281 A1* | 3/2011 | Gao et al. | 438/746 |

* cited by examiner

APPLICATION OF MILLISECOND HEATING SOURCE FOR SURFACE TREATMENT

CROSS-REFERENCES TO RELATED APPLICATIONS

This application claims priority to Chinese Application No. 200910194917.9 filed on Aug. 31, 2009 commonly assigned and are hereby incorporated by reference in their entirety for all purposes.

BACKGROUND OF THE INVENTION

The present invention is directed to integrated circuits and their processing for the manufacture of semiconductor devices. More particularly, embodiments of the invention provide a method for treatment of a surface region of a semiconductor substrate for epitaxial material growth for a strained silicon MOS device, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of a process that has limitations based upon a given feature size is the formation of epitaxial materials for MOS transistor devices. Such epitaxial materials are often formed for devices having a design rule of 90 nanometers and less. These epitaxial materials, including silicon germanium, are often formed within etched source/drain regions to cause strain in a channel region of an MOS device. Unfortunately, it is often difficult to form high quality epitaxial silicon germanium materials using conventional technologies. That is, difficulties arise in making each of these strained materials as device sizes decrease. These and other limitations of conventional epitaxial structures can be found throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method for treatment of a surface region of a semiconductor substrate for epitaxial material growth for a strained silicon MOS device, but it would be recognized that the invention has a much broader range of applicability.

In a specific embodiment, the present invention provides a method for fabricating semiconductor devices, e.g., strained silicon MOS device. The method includes providing a semiconductor substrate (e.g., silicon wafer) having a surface region, which has one or more contaminants. In a specific embodiment, the one or more contaminants include at least a carbon species. The surface region has an overlying oxide layer in a specific embodiment. The method also includes processing the surface region using at least a wet processing process to selectively remove the overlying oxide layer and expose the surface region including the one or more contaminants in a specific embodiment. In a preferred embodiment, the method includes subjecting the surface region to a laser treatment process for a time period of less than 1 second to increase a temperature of the surface region to greater than 1000 degrees Celsius to remove the one or more contaminants provided on the surface region. In a specific embodiment, the method also removes the laser treatment process to cause a reduction in temperature to about 300 to about 600 degrees Celsius in a time period of less than 1 second.

In an alternative specific embodiment, the present invention provides a method for fabricating semiconductor devices, e.g., strained silicon MOS device. In a specific embodiment, the present invention provides a semiconductor substrate having a thickness of material and a recessed surface region provided on a portion of the thickness of material. In a specific embodiment, the recessed surface region has one or more contaminants, which include at least a carbon species. In a specific embodiment, the surface region has an overlying oxide layer. In a specific embodiment, the present method includes processing the recessed surface region using at least a wet processing process to selectively remove the overlying oxide layer and expose the recessed surface region including the one or more contaminants. The method subjects the recessed surface region to a laser treatment process for a time period of less than 1 second to increase a temperature of the surface region to greater than 1000 degrees Celsius to remove the one or more contaminants provided on the surface region in a specific embodiment. In a preferred embodiment, the present method includes removing the laser treatment process to cause a reduction in temperature to about 300 to about 600 degrees Celsius in a time period of less than 1 second.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the present invention provides for a rapid thermal treatment process that reduces a thermal budget of the integrated circuit device according to a specific embodiment. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method for treatment of a surface region of a semiconductor substrate for epitaxial material growth for a strained silicon MOS device, but it would be recognized that the invention has a much broader range of applicability.

Figure 1:
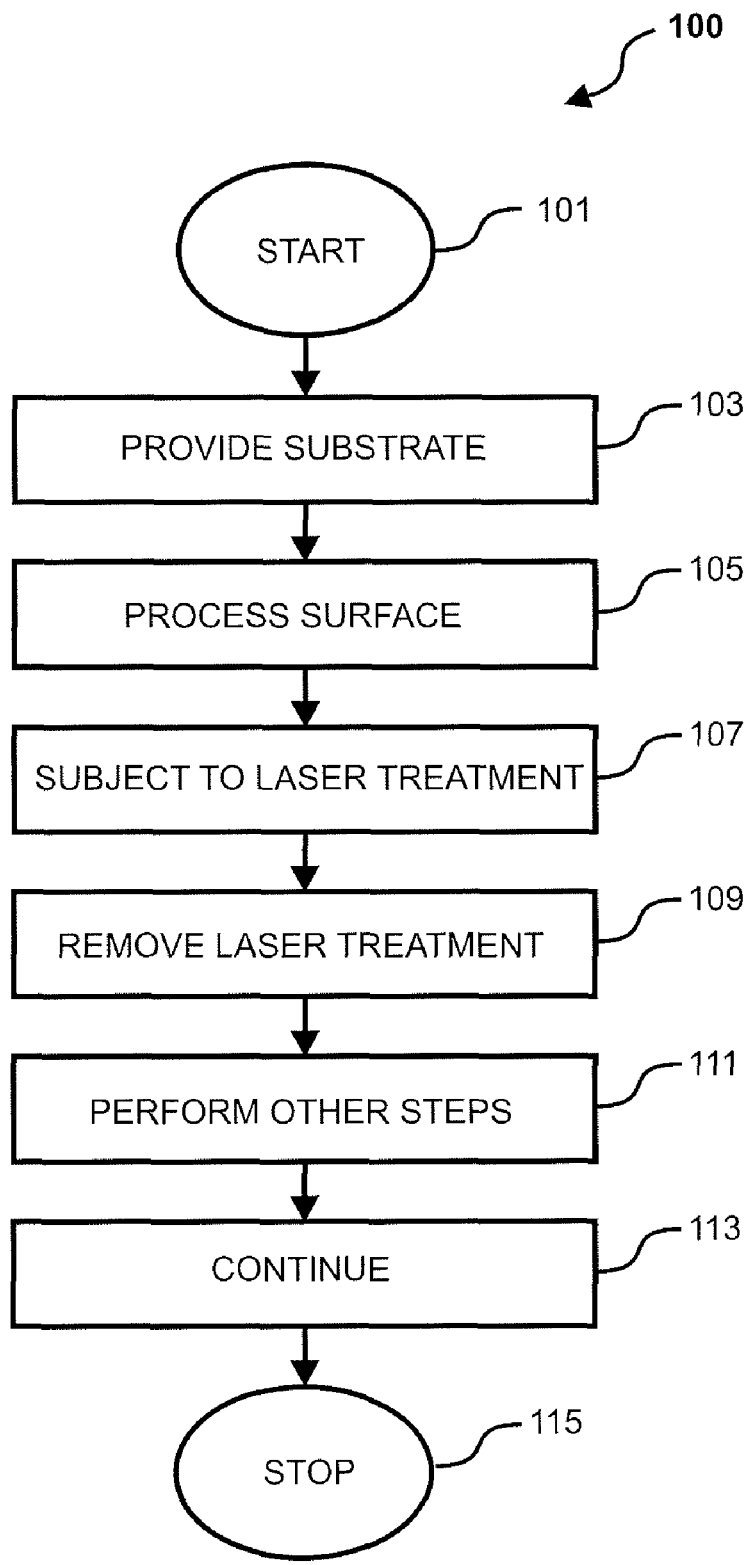
FIG. 1 is a simplified flow diagram of a method of rapid thermal processing according to an embodiment of the present invention.

Referring to FIG. 1, a method 100 for treating a surface region according to an embodiment of the present invention can be outlined as follows:

1. Begin at start, step 101;
2. Provide (step 103) a semiconductor substrate having a surface region, which has one or more contaminants, e.g., a carbon species, and an overlying oxide layer;
3. Process (step 105) the surface region using at least a wet processing step to selectively remove the overlying oxide layer and expose the surface region including the one or more contaminants;
4. Subject the surface region to a laser treatment process (step 107) for a time period of less than 1 second to increase a temperature of the surface region to greater than 1000 degrees Celsius to remove the one or more contaminants provided on the surface region;
5. Remove (e.g., complete removal or reduce the effect of) (step 109) the laser treatment process to cause a reduction in temperature to about 300 to about 600 degrees Celsius in a time period of less than 1 second;
6. Perform other processes (step 111), as desired;
7. Continue other processes (step 113); and
8. Stop (step 115).

The above sequence of steps provides a method according to an embodiment of the present invention. As shown, the method uses a combination of steps including a way of forming an integrated circuit device such as an MOS device for a CMOS integrated circuit. As shown, the method includes using a rapid thermal process for removal and/or reduction of contaminants according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 2:
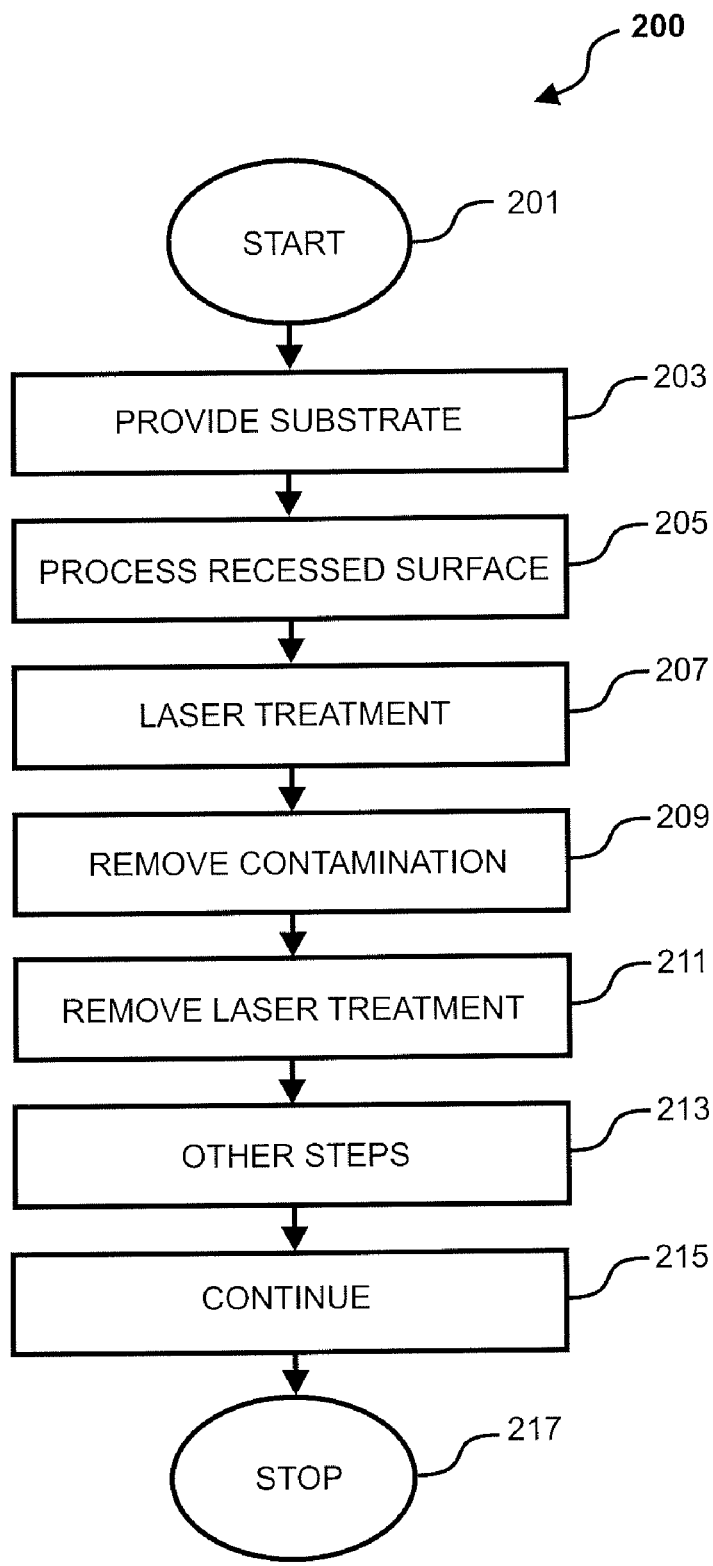
FIG. 2 is a simplified flow diagram of an alternative method of rapid thermal processing according to an alternative embodiment of the present invention.

Referring to FIG. 2, in an alternative specific embodiment, the present invention provides a method for fabricating semiconductor devices, e.g., strained silicon MOS device, which has been outlined below.

1. Begin process at start, step 201;
2. Provide (step 203) a semiconductor substrate having a thickness of material and a recessed surface region (having one or more contaminants) provided on a portion of the thickness of material;
3. Process (step 205) the recessed surface region using at least a wet processing step to selectively remove an oxide layer and expose the recessed surface region including the one or more contaminants;
4. Subject the recessed surface region to a laser treatment process (step 207) for a time period of less than 1 second to increase a temperature of the surface region to greater than 1000 degrees Celsius;
5. Cause removal (step 209) of the one or more contaminants provided on the surface region;
6. Remove (e.g., complete removal or reduce the effect of) (step 211) the laser treatment process to cause a reduction in temperature to about 300 to about 600 degrees Celsius in a time period of less than 1 second;
7. Perform (step 213) other processes, as desired;
8. Continue (step 215) other processes; and
9. Stop (step 217).

The above sequence of steps provides a method for surface treatment of a semiconductor substrate according to an embodiment of the present invention. As shown, the method uses a combination of steps including a way of forming an integrated circuit device such as an MOS device for a CMOS integrated circuit. As shown, the method includes using a rapid thermal process for removal and/or reduction of contaminants according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

Figure 3:
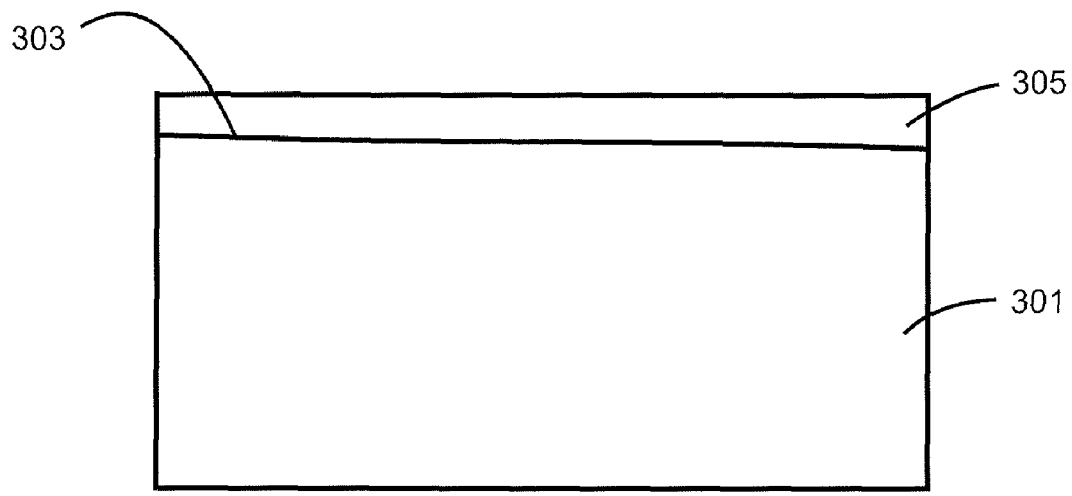
FIGS. 3 and 4 are simplified diagrams illustrating a method of rapid surface treatment process according to an embodiment of the present invention.
Figure 4:
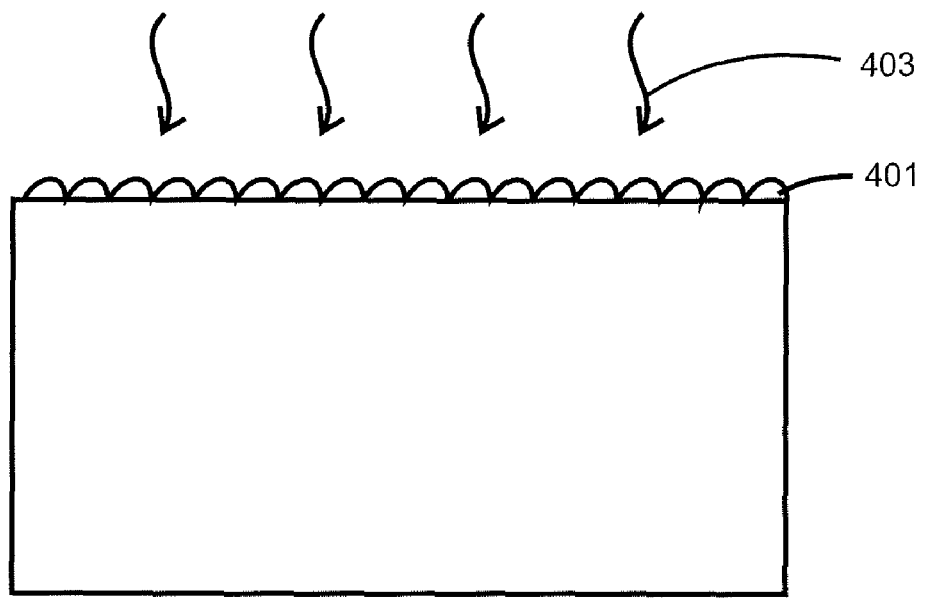

FIGS. 3 and 4 are simplified diagrams illustrating a method of rapid surface treatment process according to an embodiment of the present invention. As shown in FIG. 3, a semiconductor substrate 301 having a surface region 303 is provided. The semiconductor substrate can be a silicon wafer, a silicon on insulator substrate, or the like. The semiconductor substrate may have devices partially fabricated thereon. As shown, the semiconductor substrate has an overlying oxide layer 305, which can be a native oxide layer in a specific embodiment. In a specific embodiment, the surface region has one or more contaminants The one or more contaminants may include a carbon species, an oxygen species, a chlorine species, a hydrogen species, and others. The method includes subjecting the surface region to a wet process to remove the overlying oxide layer and exposing the one or more contaminants. The wet process uses at least a hydrofluoric acid species in a specific embodiment.

As shown in FIG. 4, the method includes subjecting the surface region including the one or more contaminants 401 to a laser treatment process 403. In a specific embodiment, the laser treatment process uses a suitable laser source providing a single wavelength of about 300 nm to about 800 nm. Preferably, the laser treatment process increases the temperature of the surface region including the one or more contaminants to more than 1000 degrees Celsius with a time period of less than one second. In a preferred embodiment, the laser treatment process is provided to a depth of 3 um or less from the surface region to cause removal of the one or more contaminants. Upon removal of the laser treatment process, the temperature of the surface region is reduced to about 300 degrees Celsius to about 600 degrees Celsius in one second or less in a specific embodiment.

In a specific embodiment, the surface region after the laser treatment process is subjected to an epitaxial growth process. The epitaxial process provides crystalline species such as silicon, germanium, a combination, or others in the surface region of the semiconductor substrate. Of course there can be other variations, modifications, and alternatives.

Figure 5:
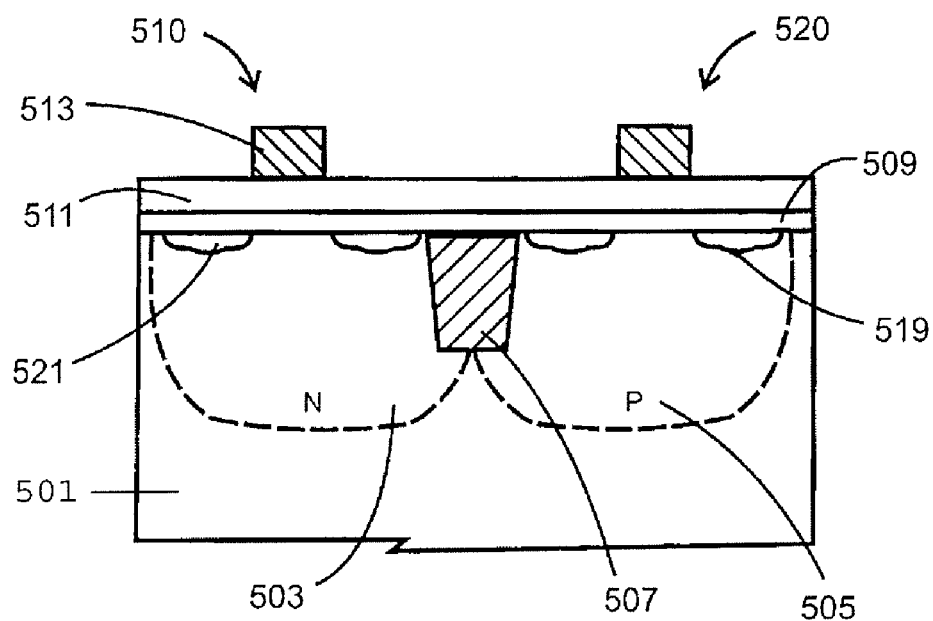
FIG. 5 through 9 are simplified cross-sectional diagrams illustrating a method of fabricating an integrated circuit device using a rapid surface treatment processing method according to an embodiment of the present invention.

FIGS. 5 through 9 are simplified cross-sectional view diagrams illustrating a method for fabricating a strained silicon CMOS device according to an embodiment of the present invention. These diagrams are merely examples, which should not unduly limit the scope of the claims herein. One of ordinary skill in the art would recognize many variations, alternatives, and modifications. As shown in FIG. 5, the present method illustrates a semiconductor integrated circuit device, e.g., CMOS, including PMOS 510 and NMOS 520 device regions. The method includes providing a semiconductor substrate 501, e.g., silicon, silicon on insulator, epitaxial silicon. The method includes forming a first well region 503 (e.g., N-type well) and a second well region 505, e.g., P-type well. Field isolation oxide regions, including shallow trench isolation oxide 507, is provided between active regions on the substrate. Of course, there can be other variations, modifications, and alternatives.

In a specific embodiment, the method includes forming a dielectric layer 509 (e.g., silicon dioxide, silicon nitride, silicon oxynitride) overlying the semiconductor substrate including the first well region and the second well region. The method forms a polysilicon gate layer 511 overlying the dielectric layer. The polysilicon gate layer can be made using a suitable technique including doped polysilicon, in situ-doped polysilicon, and/or amorphous silicon, which is crystallized. Of course, there can be other variations, modifications, and alternatives.

Figure 6:
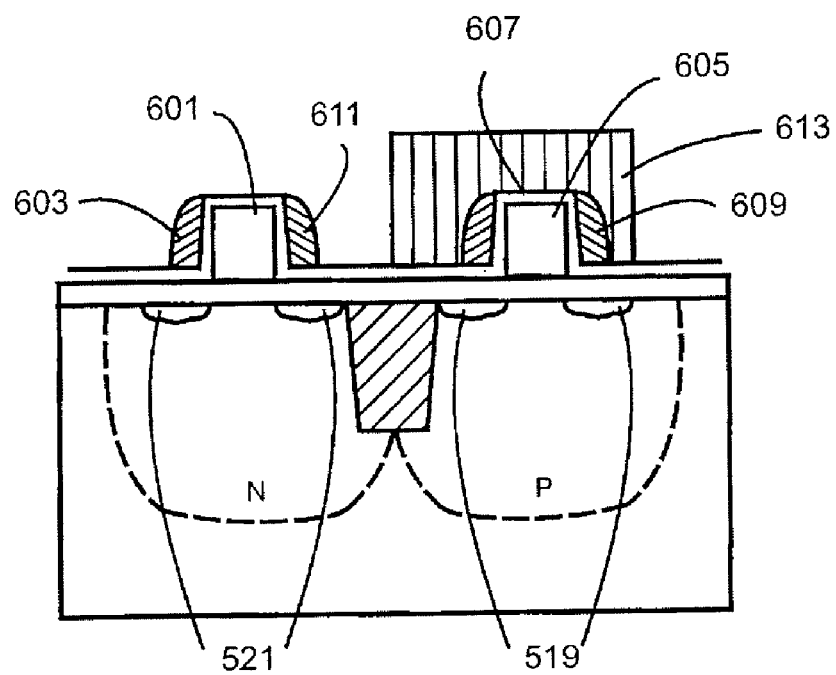

In a specific embodiment, the method forms a hard mask 513 overlying the polysilicon gate layer. The hard mask is often made of a suitable material such as silicon dioxide, silicon nitride, combinations of these, and others. As shown in FIG. 6, the method patterns the polysilicon gate layer, including the hard mask layer, to form a first gate structure 601 including first edges 603 overlying a first channel region in the first well region and a second gate structure 605 including second edge overlying a second channel region in the second well region. As shown, the first gate structure corresponds to the PMOS device region 510 and the second gate structure corresponds to the NMOS device region 520. The PMOS device region also includes lightly doped regions 521, which are often provided by implanting and/or other suitable techniques. The NMOS device region also includes lightly doped regions 519, which are often provided by implanting and/or other suitable techniques.

In a preferred embodiment, the method forms a liner layer 607 overlying the first gate structure and the second gate structure and overlying first source/drain regions in the first well region and second source/drain regions in the second well region. In a preferred embodiment, the liner layer comprises a TEOS material and/or other suitable materials, depending upon the embodiment. In a preferred embodiment, the TEOS layer has a thickness of about 100 Angstroms or greater or 150 Angstroms or greater to be a suitable liner. The TEOS can be deposited using suitable techniques such as chemical vapor deposition, atmospheric chemical vapor deposition, plasma enhanced chemical vapor deposition and the like. Of course, the particular thickness will depending upon the specific embodiment, among other factors. In a preferred embodiment, the liner layer encloses an entirety of the surface region of the NMOS and PMOS devices regions, including source/drain regions, gate structures, isolation structures, and other exposed surface regions. Of course, there can be other variations, modifications, and alternatives.

In a specific embodiment, the method forms a spacer dielectric layer overlying the liner layer. The method includes patterning the spacer dielectric layer to form first sidewall spacer structures 611 on the first gate structure, including the first edges and to form the second sidewall spacer structures 609 on the second gate structure, including the second edges, while using a portion of the liner layer 607 as a stop layer as illustrated by the simplified diagram of FIG. 6. The dielectric layer can be an oxide, a nitride, a silicon oxide/silicon nitride/silicon oxide combination, a silicon oxide/silicon nitride combination, or other suitable materials of sufficient thickness. The dielectric layer is also substantially pinhole free according to preferred embodiments. The dielectric layer is preferably less than 300 Angstroms in preferred embodiments. Of course, there can be other variations, modifications, and alternatives.

In a preferred embodiment, the method maintains the liner layer overlying the first source/drain regions and second source/drain regions during at least the patterning of the spacer dielectric layer, referring again to the simplified diagram of FIG. 6. The method protects the second well region including the second gate structure using a masking layer 613 overlying the second well region. As shown, the masking layer can be any suitable photolithographic material, such as photo resist and/or other like materials according to a specific embodiment. As shown, the masking material protects the NMOS device region including a portion of the shallow trench isolation, which separates the NMOS region from the PMOS region according to a specific embodiment.

Figure 7:
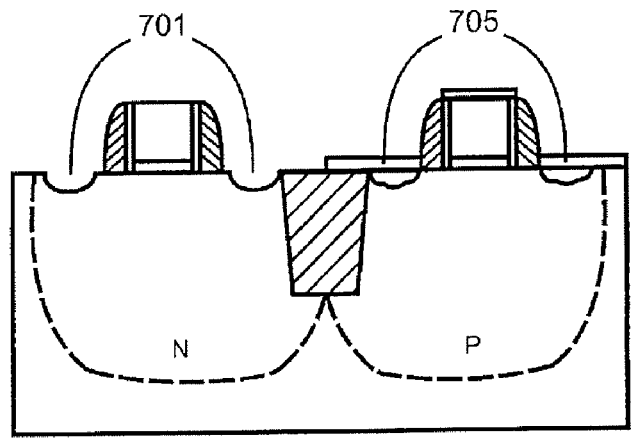

Next, as shown in FIG. 7, the method etches a first source region and a first drain region adjacent to the first gate structure using the masking layer and the first sidewall spacers as a protective layer. A portion of the liner layer overlying the PMOS device region and portion of the shallow trench isolation is removed. Etching occurs in the first source/drain regions, which are substantially silicon based, while other portions of dielectric material act as masking materials according to a specific embodiment. Etching occurs using a plasma etch process to form recessed regions 701. Next, the method strips the masking layer overlying the second well region while exposing a portion of the liner layer 705 overlying the second well region.

In a specific embodiment, the recessed surface region has one or more contaminants, which include at least a carbon species. In a specific embodiment, the surface region has an overlying oxide layer. In a specific embodiment, the present method includes processing the recessed surface region using at least a wet processing process to selectively remove the overlying oxide layer and expose the recessed surface region including the one or more contaminants. The method subjects the recessed surface region to a laser treatment process for a time period of less than 1 second to increase a temperature of the surface region to greater than 1000 degrees Celsius to remove the one or more contaminants provided on the surface region in a specific embodiment. In a preferred embodiment, the present method includes removing the laser treatment process to cause a reduction in temperature to about 300 to about 600 degrees Celsius in a time period of less than 1 second.

Figure 8:
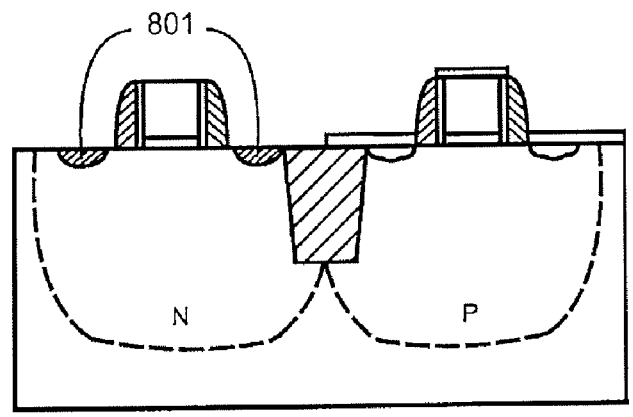

Referring to FIG. 8, the method selectively deposits a silicon germanium fill material 801 into the first source region and the first drain region to fill the etched first source region and the etched first drain region according to a specific embodiment. In a preferred embodiment, the deposition of silicon germanium fill material occurs while using a portion of the liner layer overlying the second well region as a masking material. In a preferred embodiment, the silicon germanium fill material causes the first channel region between the first source region and the first drain region to be strained in compressive mode from at least the silicon germanium material formed in the first source region and the first drain region.

In a preferred embodiment, the method includes a self-aligned silicon recess etch that can include a lining TEOS etch step and single crystal silicon etch step on the PMOS source and drain regions. The method also includes a photo resist strip, and SiGe epitaxial growth. Since the epitaxial growth can only be grown on exposed silicon surfaces, it can only grow on source and drain regions of PMOS, while the other regions of silicon dioxide, silicon nitride, or the like materials remains free from silicon germanium bearing materials according to a specific embodiment.

In a preferred embodiment, the silicon germanium fill material is single crystalline and deposited using an epitaxial reactor. The ratio of silicon/germanium is 10% to 20% according to a specific embodiment. The etched source region and the etched drain region are each coupled to the gate structure. As shown, the device has a strained channel region between the filled source region and the filled drain region from at least the silicon germanium material formed in the etched source region and the etched drain region. The device also has lightly doped drain regions or implant regions, which are formed before growing the silicon/germanium material in the recessed regions. Of course, there can be other variations, modifications, and alternatives.

Figure 9:
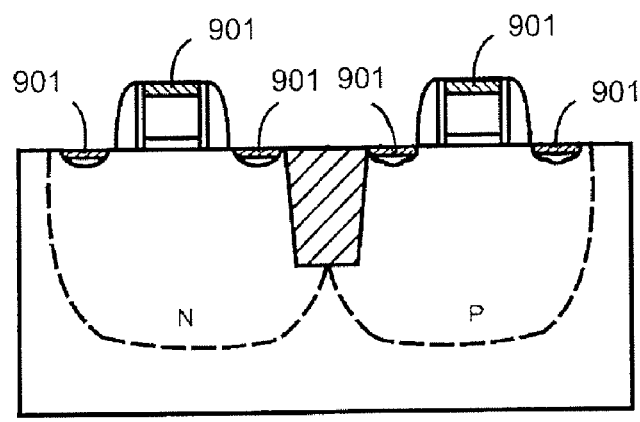

Referring to FIG. 9, the method strips any remaining portion of the liner layer according to a specific embodiment. Concurrent with stripping of the liner layer, the method strips the hard mask material, which can be selectively removed from the polysilicon gate structures. Depending upon the embodiment, a silicided material 901 (e.g., titanium, tungsten, cobalt, nickel, platinum, and others) can be provided overlying the polysilicon gate structure, as well as other active portions, e.g., source/drain regions, of the PMOS and NMOS device structures.

In a preferred embodiment, a silicide block layer can be formed by deposition of a SiO$_2$ layer and selectively removal of the SiO$_2$ layer by photo mask pattern and etch if desired. In a specific embodiment, the method includes a self-aligned silicidation process carried out by deposition of certain refractory metals such as nickel (Ni), cobalt (Co), titanium (Ti) and others, for example, followed by a titanium nitride (TiN) cap layer, as merely an example. In a specific embodiment, the method includes a rapid thermal anneal (RTA) carried out followed by a wet strip removing any unreacted metals. A second RTA can then be applied to complete the silicide phase transformation according to a specific embodiment. A SiNx film with high tensile stress is then deposited on the structures by plasma enhanced chemical vapor deposition (PECVD), for example, or other suitable technique. The silicon nitride film thickness ranges from about 200 Angstroms to 1200 Angstroms and is provided overlying the NMOS devices to cause strain in a tensile mode in the NMOS channel region.

In a specific embodiment, the method also includes forming an interlayer dielectric material overlying the entirety of the PMOS and NMOS device structures. In a preferred embodiment, the interlayer dielectric, such as boro-phosphate-silicate-glass (BPSG), boro-silicate glass (BSG), phosphosilicate glass (PSG) or high density plasma (HDP) film is then deposited followed by PECVD oxide layer. Depending upon the specific embodiment, the interlayer dielectric can be a single material, a combination of layers, and the like. The method also includes contact pattern and formation performed to complete the PMOS and NMOS integration on strained silicon. Of course, there can be other variations, modifications, and alternatives.

Although the above has been described in terms of an MOS device, there can be other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating semiconductor devices, the method comprising:

providing a semiconductor substrate having a surface region, the surface region having one or more contaminants, the one or more contaminants including at least a carbon species, the surface region having an overlying oxide layer;

processing the surface region using at least a wet process to selectively remove the overlying oxide layer and expose the surface region including the one or more contaminants;

subjecting the surface region to a laser treatment process for a time period of less than 1 second to increase a temperature of the surface region to greater than 1000 degrees Celsius to remove the one or more contaminants from the surface region; and removing the laser treatment process to cause a reduction in temperature to about 300 to about 600 degrees Celsius in a time period of less than 1 second.

2. The method of claim 1 wherein the one or more contaminants comprise an oxygen species.

3. The method of claim 1 wherein the one or more contaminants cause one or more defects in an overlying epitaxial layer.

4. The method of claim 1 further comprising maintaining the surface region in an argon environment during the laser treatment process.

5. The method of claim 1 wherein the laser treatment process is provided to the surface region to a depth of about 3 microns from the surface region.

6. The method of claim 1 wherein the surface region is an etched region.

7. The method of claim 6 wherein the etched region is provided for a silicon germanium material.

8. The method of claim 1 wherein the oxide layer is a native oxide.

9. The method of claim 1 wherein the laser treatment process is characterized by a single wavelength of light.

10. The method of claim 1 wherein the laser treatment process is characterized by a wavelength of about 300 nm to 800 nm.

11. The method of claim 1 wherein the one or more contaminants includes a chlorine species.

12. The method of claim 1 wherein the one or more contaminants includes a hydrogen species.

13. A method for fabricating semiconductor devices, the method comprising:

providing a semiconductor substrate having a thickness of material and a recessed surface region provided on a portion of the thickness of material, the recessed surface region having one or more contaminants, the one or more contaminants being at least a carbon species, the surface region having an overlying oxide layer;

processing the recessed surface region using at least a wet process to selectively remove the overlying oxide layer and expose the recessed surface region including the one or more contaminants;

subjecting the recessed surface region to a laser treatment process for a time period of less than 1 second to increase a temperature of the surface region to greater than 1000 degrees Celsius to remove the one or more contaminants from the surface region; and removing the laser treatment process to cause a reduction in temperature to about 300 to about 600 degrees Celsius in a time period of less than 1 second.

14. The method of claim 13 wherein the one or more contaminants comprise an oxygen species.

15. The method of claim 13 wherein the one or more contaminants cause one or more defects in an overlying epitaxial layer.

16. The method of claim 13 further comprising maintaining the surface region in an argon environment during the laser treatment process.

17. The method of claim 13 wherein the laser treatment process is provided to the recessed surface region to a depth of about 3 microns from the surface region.

18. The method of claim 13 wherein the recessed surface region is an etched region.

19. The method of claim 18 wherein the etched region is provided for a silicon germanium material.

20. The method of claim 13 wherein the overlying oxide layer is a native oxide.

21. The method of claim 13 wherein the laser treatment process is characterized by a single wavelength of light.

22. The method of claim 13 wherein the laser treatment process is characterized by a wavelength of about 300 nm to 800 nm.

23. The method of claim 13 wherein the one or more contaminants include a chlorine species.

24. The method of claim 13 wherein the one or more contaminants include a hydrogen species.

* * * * *